United States Patent
Hsu et al.

(10) Patent No.: US 10,056,448 B2
(45) Date of Patent: Aug. 21, 2018

(54) COPLANAR METAL-INSULATOR-METAL CAPACITIVE STRUCTURE

(71) Applicant: Taiwan Semiconductor Manufacturing Company, Ltd., Hsin-Chu (TW)

(72) Inventors: Chern-Yow Hsu, Hsin-Chu County (TW); Shih-Chang Liu, Kaohsiung County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/603,527

(22) Filed: May 24, 2017

(65) Prior Publication Data
US 2017/0256606 A1    Sep. 7, 2017

Related U.S. Application Data

(62) Division of application No. 14/847,842, filed on Sep. 8, 2015, now Pat. No. 9,666,661.

(51) Int. Cl.
*H01L 29/92* (2006.01)
*H01L 49/02* (2006.01)
*H01L 21/321* (2006.01)

(52) U.S. Cl.
CPC .......... *H01L 28/87* (2013.01); *H01L 21/3212* (2013.01); *H01L 28/40* (2013.01); *H01L 28/60* (2013.01)

(58) Field of Classification Search
CPC ..... H01L 21/3212; H01L 28/40; H01L 28/60; H01L 28/87
See application file for complete search history.

(56) References Cited

U.S. PATENT DOCUMENTS

| | | | |
|---|---|---|---|
| 6,413,832 B1 | 7/2002 | Wu et al. | |
| 6,431,959 B1 | 8/2002 | Mikhaylich et al. | |
| 6,532,824 B1 * | 3/2003 | Ueno ................. | G01B 7/22 73/780 |
| 7,594,198 B2 | 9/2009 | Chen | |
| 7,763,519 B2 | 7/2010 | Barth et al. | |
| 8,324,658 B2 | 12/2012 | Tsai et al. | |
| 8,334,571 B2 | 12/2012 | Tsai et al. | |
| 8,541,848 B2 | 9/2013 | Huang et al. | |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |

(Continued)

*Primary Examiner* — Allan R Wilson
(74) *Attorney, Agent, or Firm* — Hayne and Boone LLP

(57) ABSTRACT

A method of fabricating a metal-insulator-metal (MIM) capacitor structure on a substrate includes forming a patterned metal layer over the substrate; forming an insulator layer over the patterned metal layer; forming a second metal layer over the insulator layer; removing part of the insulating layer and part of the second metal layer thereby forming a substantially coplanar surface that is formed by the patterned metal layer, the insulator layer, and the second metal layer; removing a portion of the second metal layer and a portion of the patterned metal layer to form a fin from the insulator layer that protrudes beyond the first metal layer and the second metal layer; and forming an inter-metal dielectric layer over the fin.

20 Claims, 16 Drawing Sheets

(56) References Cited

U.S. PATENT DOCUMENTS

| | | |
|---|---|---|
| 8,792,218 B2 | 7/2014 | Tsai |
| 8,854,778 B2 | 10/2014 | Chu et al. |
| 8,867,183 B2 | 10/2014 | Chen et al. |
| 8,901,711 B1 * | 12/2014 | Yang ................ H01L 28/75 257/534 |
| 9,455,313 B1 | 9/2016 | Christensen et al. |
| 2003/0027386 A1 | 2/2003 | Lee |
| 2004/0075131 A1 * | 4/2004 | Ahn .............. H01L 21/76895 257/306 |
| 2004/0113235 A1 | 6/2004 | Coolbaugh et al. |
| 2005/0024979 A1 | 2/2005 | Kim et al. |
| 2006/0172484 A1 | 8/2006 | Chung et al. |
| 2007/0042542 A1 | 2/2007 | Barth et al. |
| 2008/0265369 A1 * | 10/2008 | Liaw ............... H01L 23/5223 257/532 |
| 2010/0087042 A1 * | 4/2010 | Kim ............... H01L 23/5223 438/396 |
| 2011/0156207 A1 | 6/2011 | Dundulachi et al. |
| 2013/0093052 A1 | 4/2013 | Ma et al. |
| 2013/0119433 A1 | 5/2013 | Wang |
| 2013/0170080 A1 | 7/2013 | Chen |
| 2013/0342941 A1 | 12/2013 | Wang et al. |
| 2014/0118869 A1 | 5/2014 | Meng et al. |
| 2014/0175611 A1 | 6/2014 | Hsu |
| 2014/0183518 A1 | 7/2014 | Tsai et al. |
| 2014/0210014 A1 | 7/2014 | Ma et al. |
| 2014/0217461 A1 | 8/2014 | Song et al. |
| 2014/0226241 A1 | 8/2014 | Tseng et al. |
| 2014/0307355 A1 | 10/2014 | Tsai et al. |
| 2017/0069709 A1 | 3/2017 | Hsu et al. |

\* cited by examiner

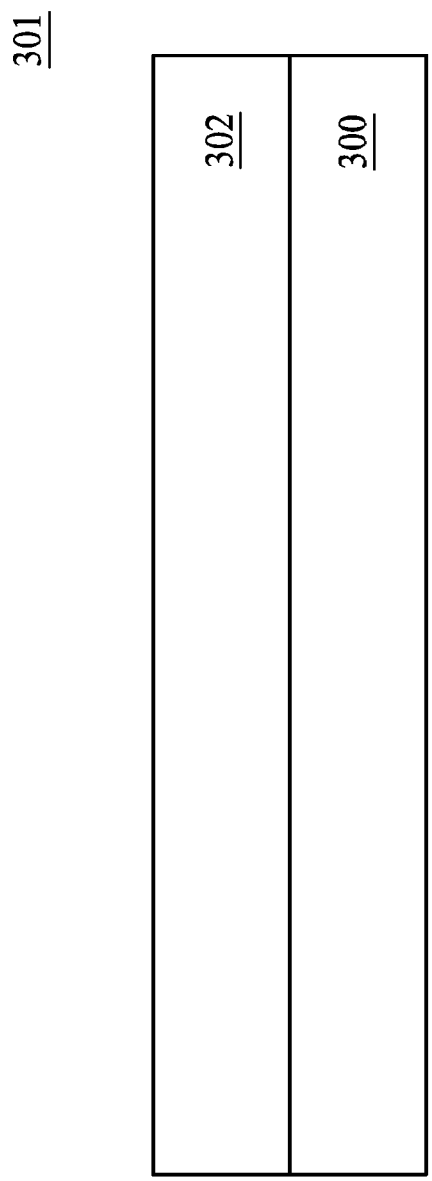

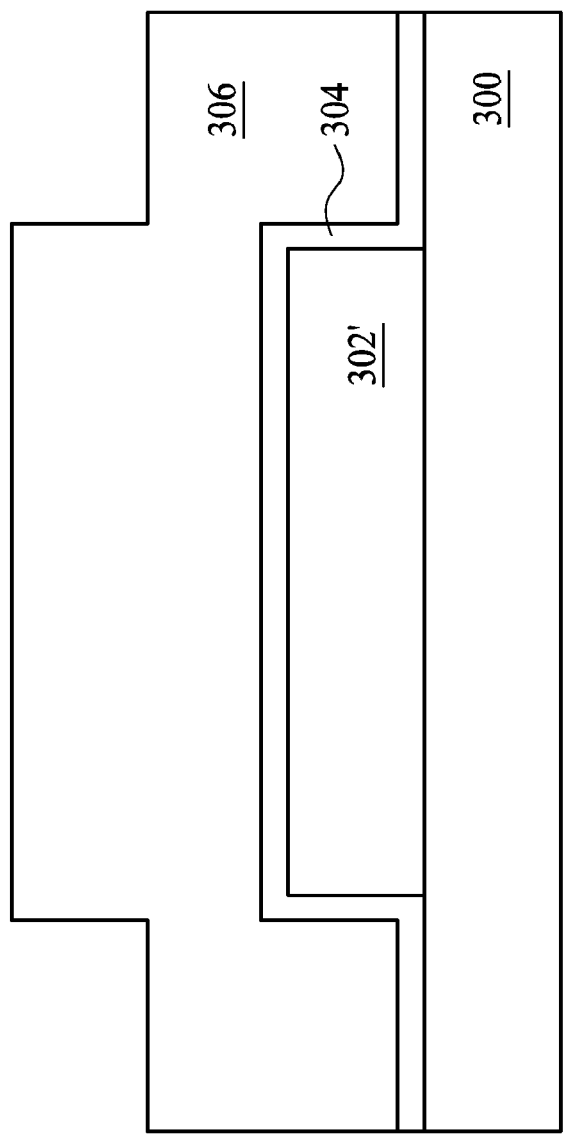

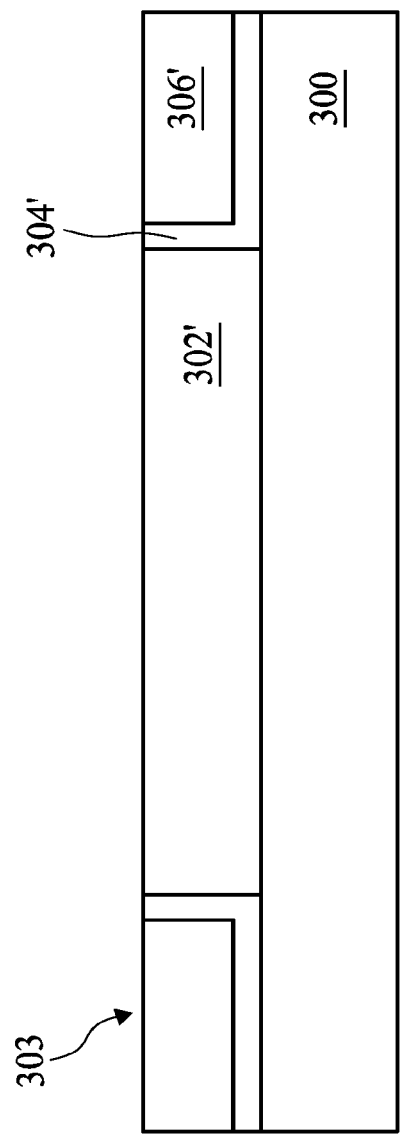

COPLANAR METAL-INSULATOR-METAL CAPACITIVE STRUCTURE

PRIORITY DATA

The present application is a divisional application of U.S. application Ser. No. 14/847,842, filed Sep. 8, 2015, which is hereby incorporated by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, and some of these involve capacitive structures. Such capacitive structures include, for example, metal-oxide-semiconductor (MOS) capacitors, p-n junction capacitors and metal-insulator-metal (MIM) capacitors. In some applications, MIM capacitors can provide certain advantages over MOS and p-n junction capacitors because the frequency characteristics of MOS and p-n junction capacitors may be restricted as a result of depletion layers that form in the semiconductor electrodes. A MIM capacitor can exhibit improved frequency and temperature characteristics. Furthermore, MIM capacitors are formed in the metal interconnect layers, thereby reducing CMOS transistor process integration interactions or complications.

However, in order to couple an MIM capacitor to an interconnect line, a via is generally used to bridge an electrode of an MIM capacitor and an interconnect line. Forming such a via to bridge a conventional MIM capacitor may cause damage to at least one of the electrodes of the MIM capacitor and may in turn disadvantageously affect performance of the MIM capacitor (e.g., leakage current, undesirable frequency performance). Thus, an improved structure of an MIM capacitor may be needed.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIGS. 3A, 3B, 3C, 3D, 3E, 3F, 3G, 3H, 3I, and 3J depict a cross-section of a metal-insulator-metal (MIM) capacitor fabricated by using the method of FIG. 2.

Figure 1:
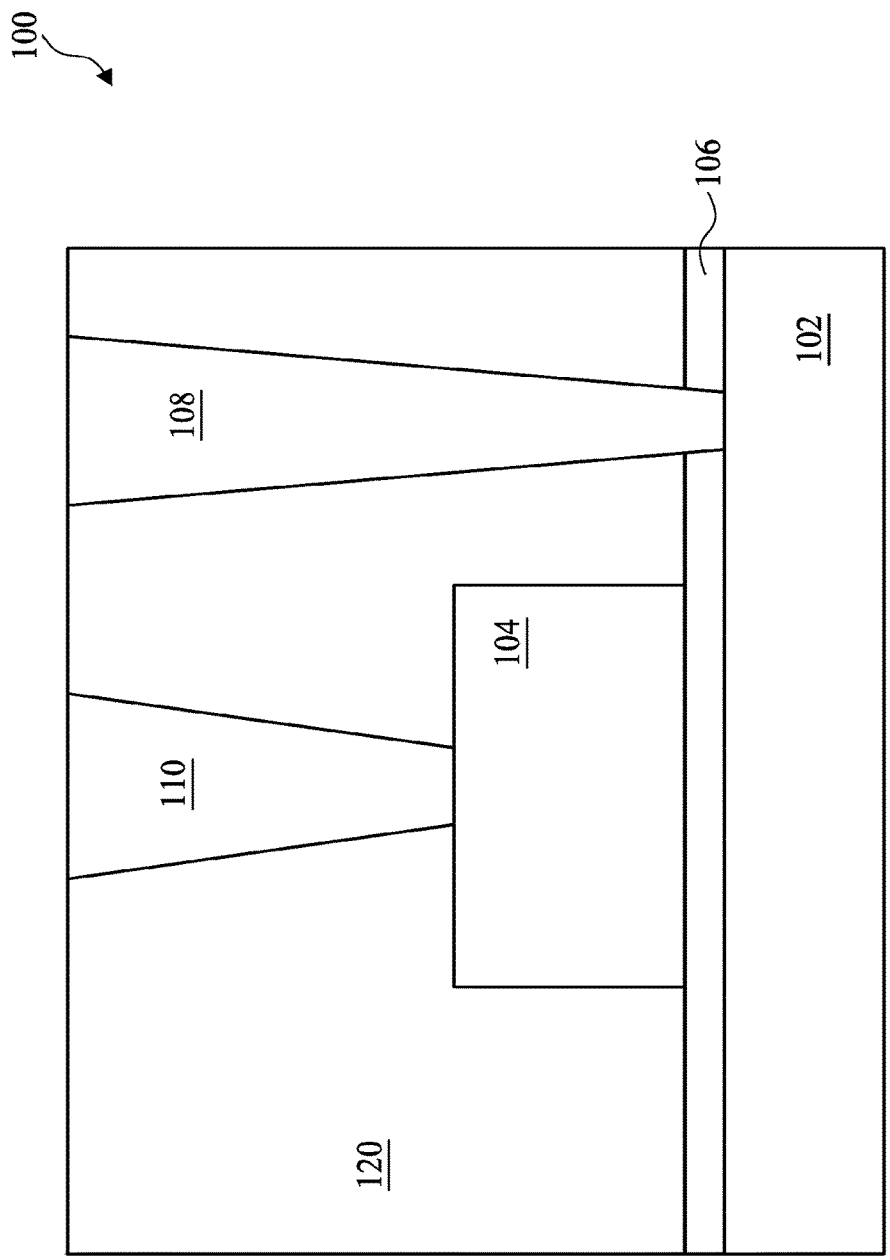
FIG. 1 depicts a cross-section of a metal-insulator-metal (MIM) capacitor.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

A vertically stacked MIM capacitor 100 is shown in FIG. 1. MIM capacitor 100 includes a bottom electrode 102, an insulator 106, and a top electrode 104. In order to connect (bridge) the bottom electrode 102 and the bottom electrode 104, at least two vias are formed: via 108 is configured to connect the bottom electrode 102 to a conductive layer (e.g., an interconnect line) and via 110 is configured to connect the top electrode 104 to another conductive layer (e.g., an interconnect line). In such a vertical configuration of a bottom electrode and a top electrode, damage is caused during forming the respective vias. For example, in the illustrated embodiment of FIG. 1, an etching process (e.g., a plasma induced etching) may be used to recess insulator layer 120 to form two passages from a top surface of the insulator layer 120 to the electrodes, then a conductive material may be filled into the formed passages to form the respective vias. Since the top electrode 104 includes a top surface that is relatively higher than a top surface of the bottom electrode 102, the etching process causes damage to the top surface of the top electrode 104 during the etching process of forming the passage to reach the top surface of the bottom electrode 102.

Figure 2:
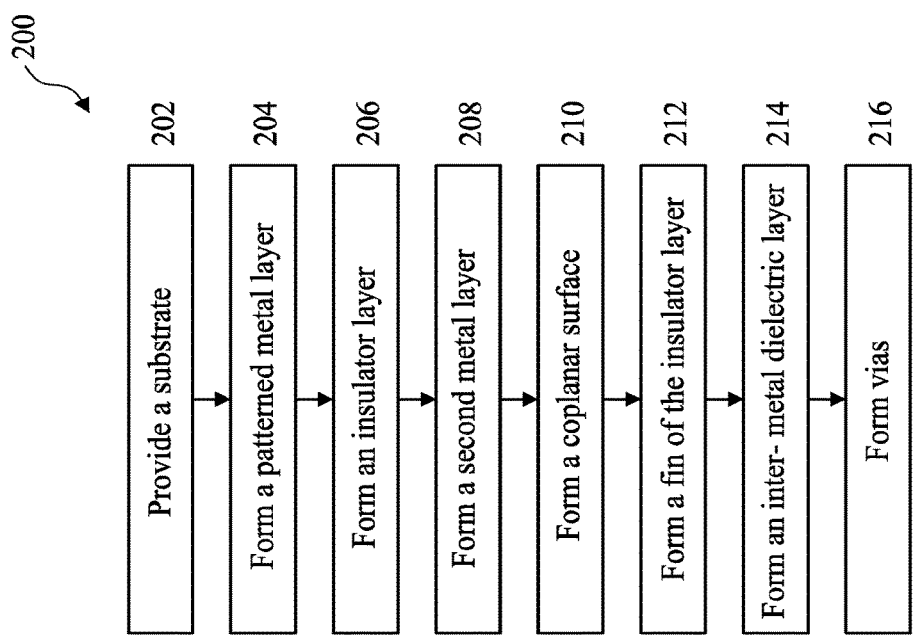
FIG. 2 depicts a method of fabricating a metal-insulator-metal (MIM) capacitor.

FIG. 2 is a flowchart of a method 200 of fabricating a substantially coplanar MIM capacitor 301 constructed according to various aspects of the present disclosure in one or more embodiments to avoid damaging the electrodes during manufacturing processes. The method 200 is described with reference to FIG. 2 and in conjunction with FIGS. 3A, 3B, 3C, 3D, 3E, 3F, 3G, 3H, 3I, and 3J. In some embodiments, the MIM capacitor 301 fabricated according to the disclosed method 200 may be a memory element of a resistive random-access memory (RRAM) cell and/or of a suitable type of various non-volatile computer memory cells. It is understood that additional steps can be provided before, during, and/or after the method 200, and some of the steps described can be replaced, eliminated, and/or moved around for additional embodiments of the method 200.

The method 200 begins at operation 202 with providing a substrate 300. In some embodiments, the substrate 300 is an insulator layer. In some specific embodiments, the substrate 300 may serve as an inter-metal dielectric (IMD) layer. During the operation 202, the substrate 300 may include a first metal layer 302 as shown in FIG. 3A, or in some alternative embodiments, the first metal layer 302 is later formed over the substrate 300 by a suitable process (e.g., sputtering, e-beam evaporation). According to current embodiments, the first metal layer 300 is formed of a conductive material selected from a group consisting of: Ta, Ti, TaN, TiN, W, Cu, Al, Ir, Ru, Pt, and a combination hereof. Other conductive materials may be used to form the first metal layer 300 and will still fall within the scope of the disclosed embodiment.

Figure 4A:
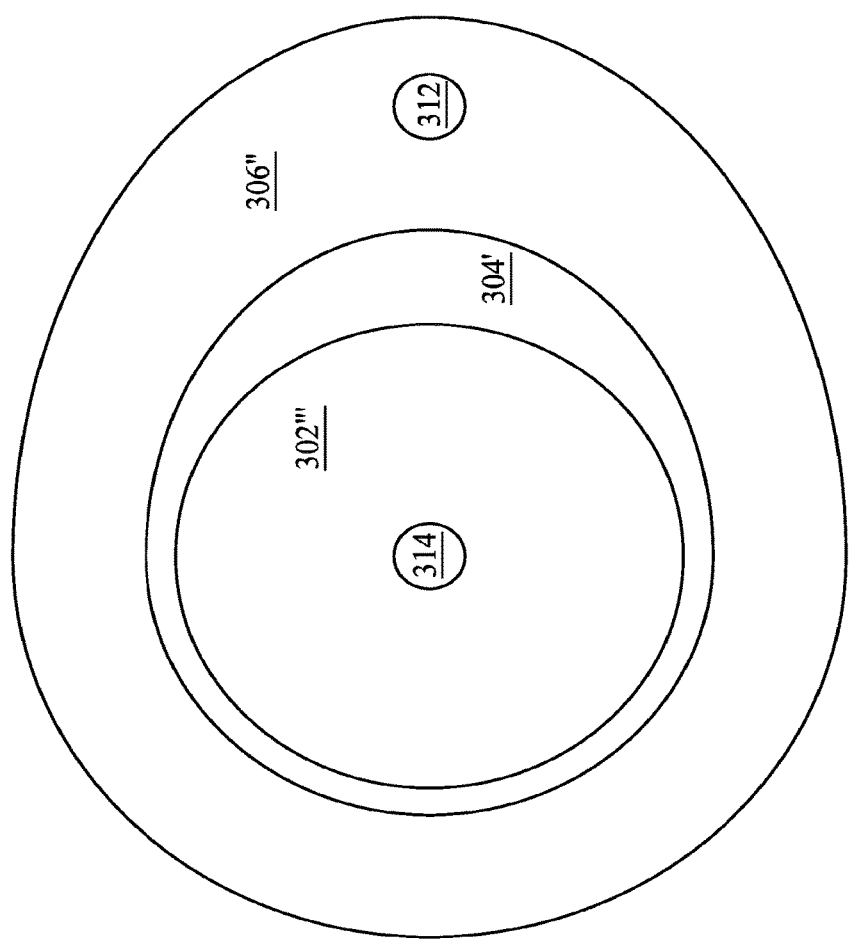
FIG. 4A depicts a top view of a metal-insulator-metal (MIM) capacitor fabricated by using the method of FIG. 2.
Figure 4B:
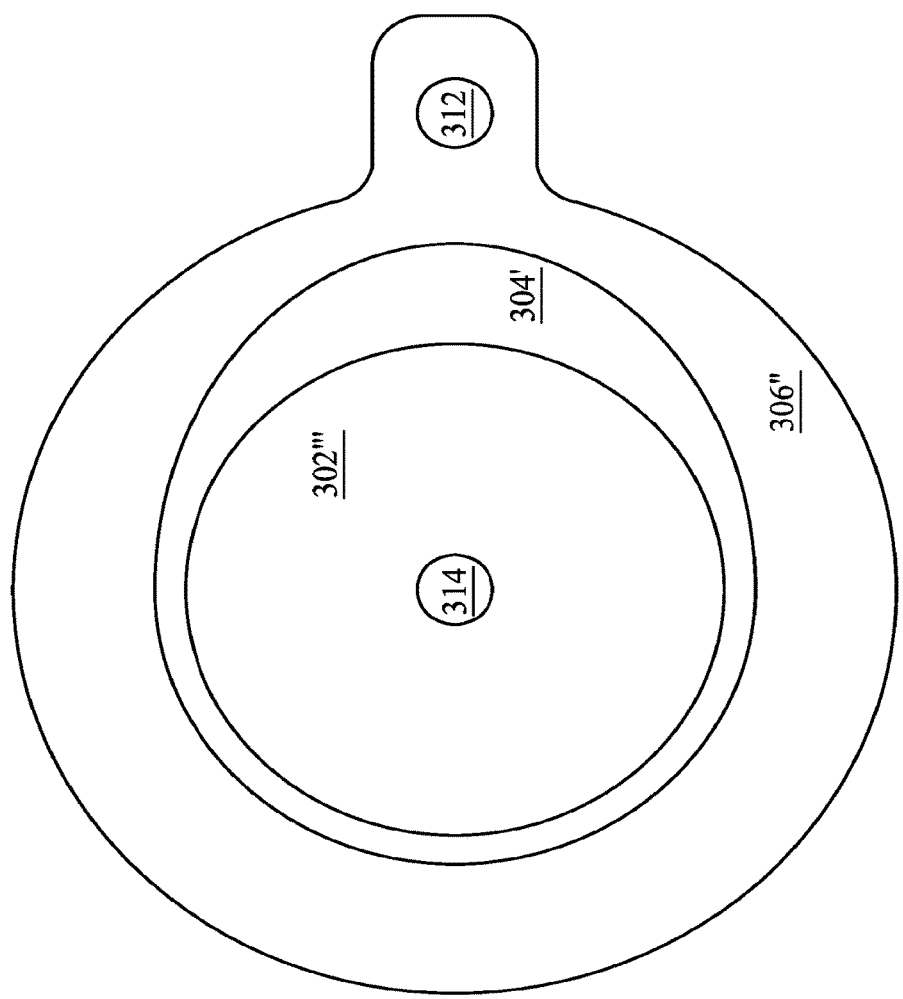
FIG. 4B depicts a top view of a metal-insulator-metal (MIM) capacitor fabricated by using the method of FIG. 2.
Figure 5A:
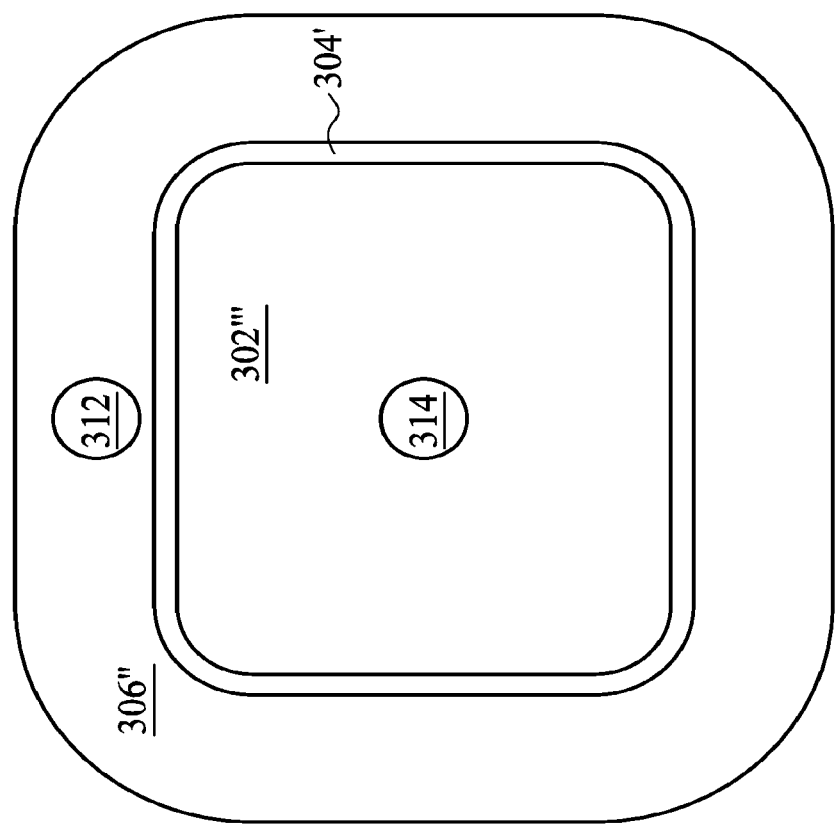
FIG. 5A depicts a top view of a metal-insulator-metal (MIM) capacitor fabricated by using the method of FIG. 2.
Figure 5B:
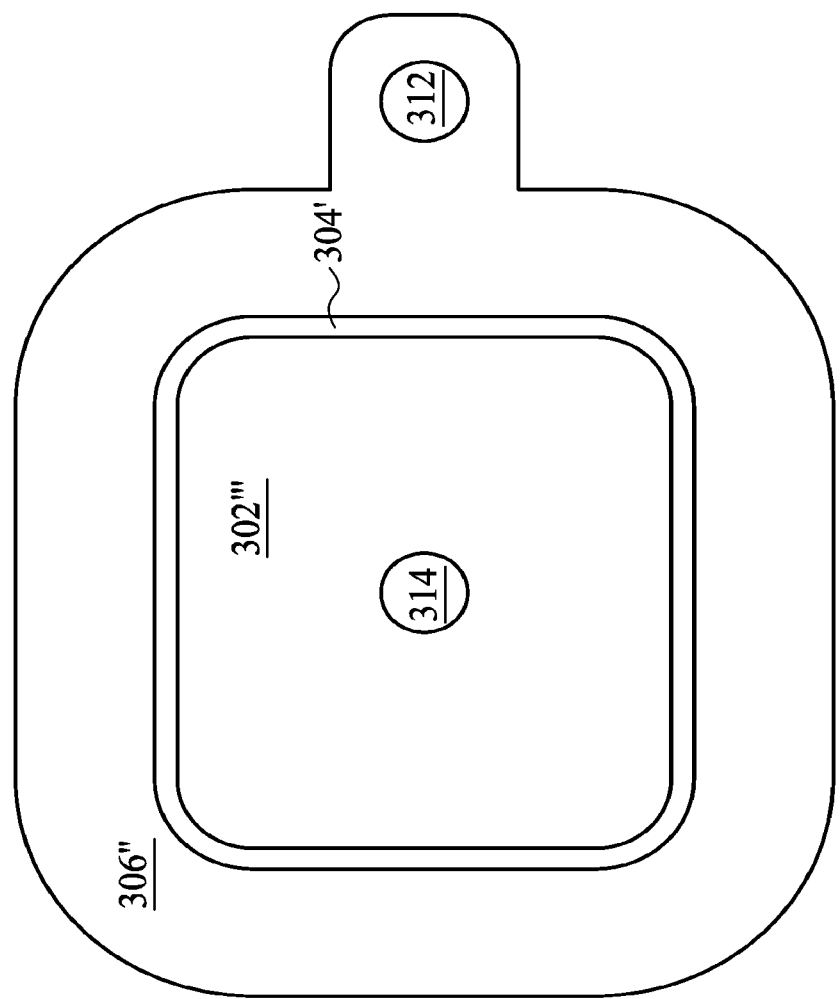
FIG. 5B depicts a top view of a metal-insulator-metal (MIM) capacitor fabricated by using the method of FIG. 2.

The method 202 then proceeds to operation 204 with forming a patterned metal layer 302'. In some embodiments, forming the patterned metal layer 302' may include conducting a photolithography process, a maskless lithography process, or a variety of processes suitable for transferring a pattern to the first metal layer 302. This may be done by a number of combinations of material removal processes or it may be accomplished by a single material removal process. Furthermore, in accordance with various illustrative embodiments, the patterned metal layer 302' may be formed in a variety of shapes such as for example a circle (as illustrated in FIGS. 4A and 4B), a curvilinear shape, and/or a polygon with rounded corners (as illustrated in FIGS. 5A and 5B).

Figure 3B:
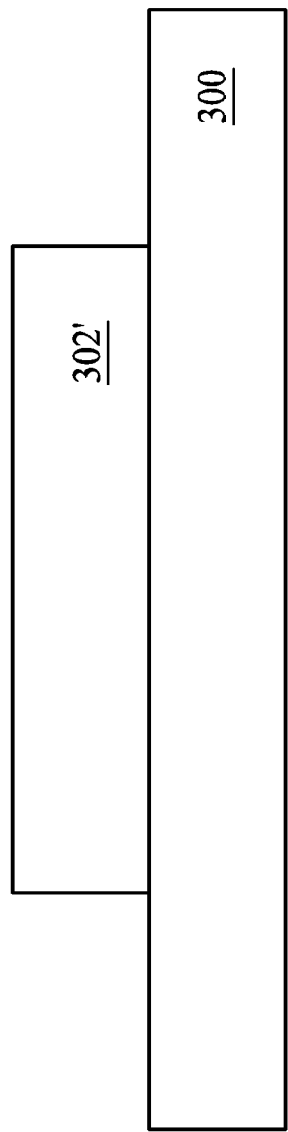
Figure 3C:

The method 200 continues at operation 206 with forming an insulator layer 304 overlaying the patterned metal layer 302' and the substrate 300 as illustrated in FIG. 3C. The insulator layer 304 may include a dielectric layer and/or a high-k dielectric material layer. In the example in which the insulator layer 304 is a dielectric layer, the insulator layer 304 may be formed of oxide, silicon oxide, and/or SiN with a thickness ranging between about 5 nanometers to about 40 nanometers. In the example in which the insulator layer 304 is a high-k material layer, the insulator layer 304 may be formed of $Al_2O_3$, $ZrO_2$, $Ta_2O_5$, $HfO_2$, $La_2O_3$, $TiO_2$, $SiO_2$, or a combination hereof. Further, such a high-k material layer may include a thickness ranging between about 1.5 nanometers to about 15 nanometers. A variety of suitable processes including chemical vapor depositions (CVD), low-pressure CVD (LPCVD), plasma-enhanced CVD (PECVD), and atomic layer deposition (ALD) may be used to form the insulator layer 304 at operation 206.

The method 200 continues to operation 208 with forming a second metal layer 306 overlaying the insulator layer 304 as shown in FIG. 3D. According to current embodiments, the second metal layer 306 is formed of a conductive material selected from a group consisting of: Ta, Ti, TaN, TiN, W, Cu, Al, Ir, Ru, Pt, and a combination hereof. Other conductive materials may be used to form the second metal layer 306 and will still fall within the scope of the disclosed embodiment. In a specific embodiment, the patterned metal layer 302' may serve as a first electrode of the MIM capacitor 301, and the second metal layer 306 (or a latterly patterned second metal layer) may serve as a second electrode of the MIM capacitor 301. Details of the electrodes of the MIM capacitor 301 are discussed below.

The method 200 then proceeds to operation 210 with forming a substantially coplanar surface 303 as illustrated in FIG. 3E. According to the current embodiments, a substantial coplanar surface may be defined as a surface that is shared by at least a first surface and a second surface, wherein the first surface and the second surface are laterally aligned (i.e., the first surface and the second surface are not out of plane with respect to each other) or the first surface and the second surface are out of plane with a tolerable value (e.g., 5%). In an embodiment, the forming of the substantially coplanar surface 303 may include performing a chemical-mechanical polishing (CMP) process and/or a wet/dry etching process. During the operation 210, part of the second metal layer 306 and part of the insulator layer 304 may be removed/recessed/etched respectively to form an etched insulator layer 304' and an etched second metal layer 306' thereby forming the substantially coplanar surface 303 shared by the patterned metal layer 302', the etched insulator layer 304', and the etched second metal layer 306'. In some alternative embodiments, patterned metal layer 302' may be further patterned during operation 210.

Figure 3F:
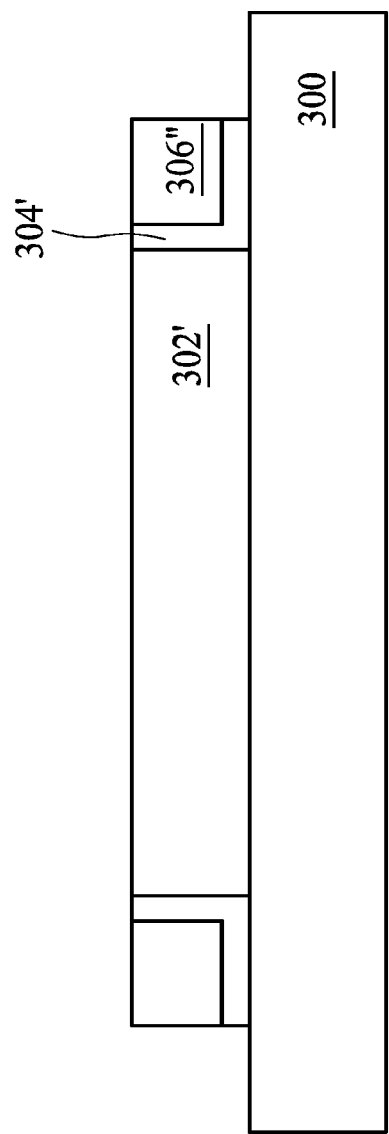

In an embodiment, an operation (not shown) may be included in the method 200 with forming a patterned second metal layer 306" as illustrated in FIG. 3F. The forming of the patterned second metal layer 306" may include conducting a photolithography process, a maskless lithography process, or a variety of processes suitable for transferring a pattern to the etched second metal layer 306'. This may be done by a number of combinations of material removal processes or it may be accomplished by a single material removal process.

Figure 3G:
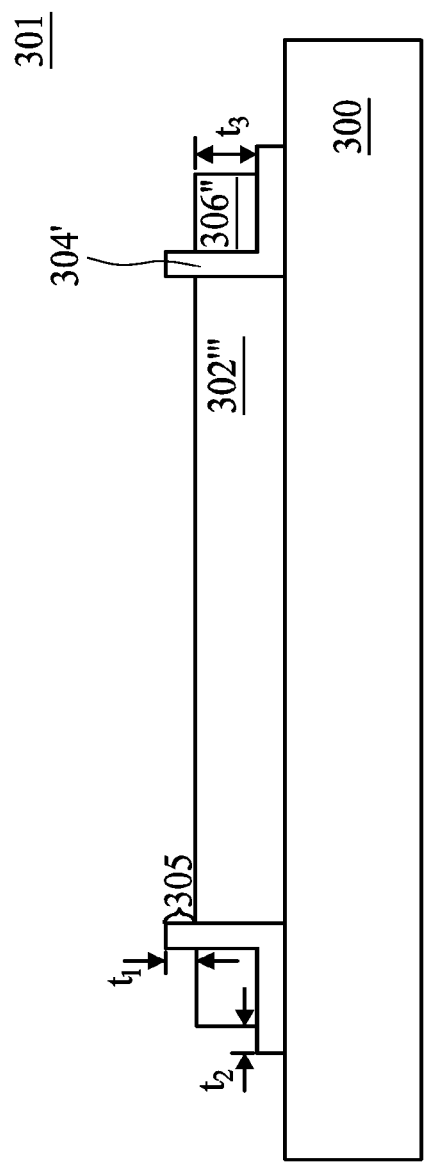

The method 200 continues to operation 212 with forming a fin 305 of the insulator layer 304' as illustrated in FIG. 3G. In accordance with various embodiments, forming the fin 305 may include a wet etching process and/or a dry etching process. In the example of performing a wet etching process, a chemical that includes a high selectivity to the insulator layer 304/304' may be used such as for example, the standard clean 1 (SC1) solution (i.e., mixture of $NH_3$, $H_2O_2$, and $H_2O$). As such, the insulator layer 304/304' may remain intact during the etching process (i.e., operation 212). Furthermore, such a wet etching process may be performed in temperature ranging between about 15° C. and about 80° C. On the other hand, in the example of performing a dry etching process, a plasma-induced reactive ion etching (RIE) and/or a chloride-based etching process may be used. In some specific embodiments, after forming the fin 305, metal layer 302''', metal layer 306" may be formed as the illustrated embodiment of FIG. 3G. Further, the formed fin 305 may include a height "t1" ranging from about 3 angstroms to about 20 angstroms; the metal layer 306" may have a width difference "t2" that is a distance between a width of the metal layer 306" and the lower portion of the insulator layer 304' (such a width difference t2 may range between about 3 angstroms to about 20 angstroms); and the metal layer 302''' and the metal layer 306" may include a same height "t3" ranging between about 40 nanometers to about 90 nanometers. This same height t3 means that the metal layer 302''' is substantially coplanar with the metal layer 306". According to the current embodiments, a substantial coplanar surface may be defined as a surface that is shared by at least a first surface and a second surface, wherein the first surface and the second surface are laterally aligned (i.e., the first surface and the second surface are not out of plane with respect to each other) or the first surface and the second surface are out of plane with a tolerable value (e.g., 5%).

Figure 3H:
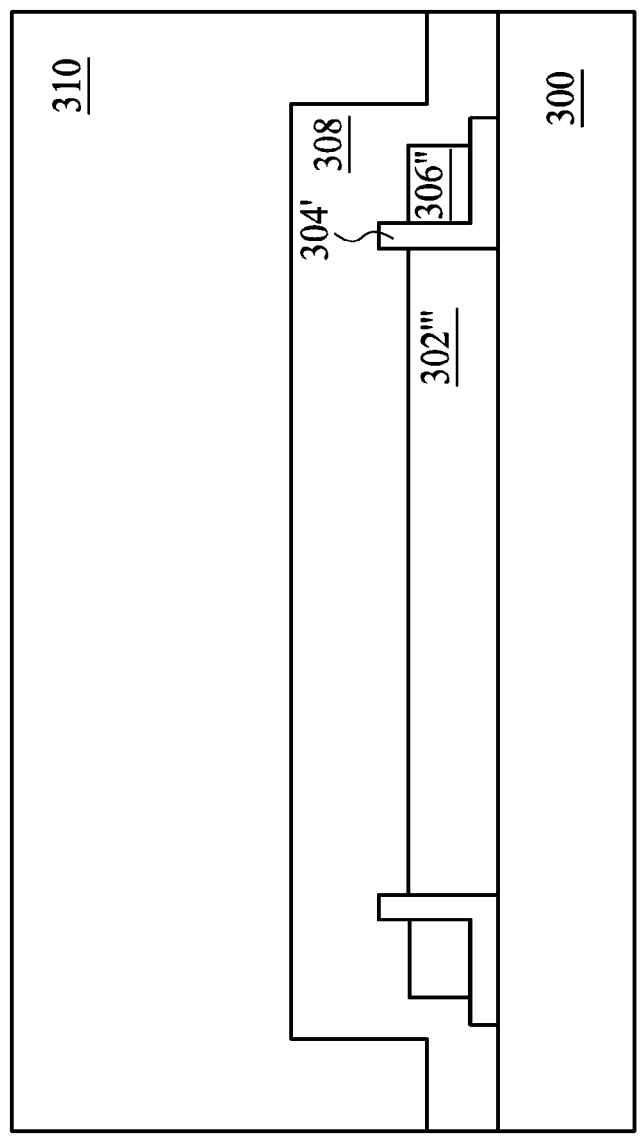
Figure 3I:
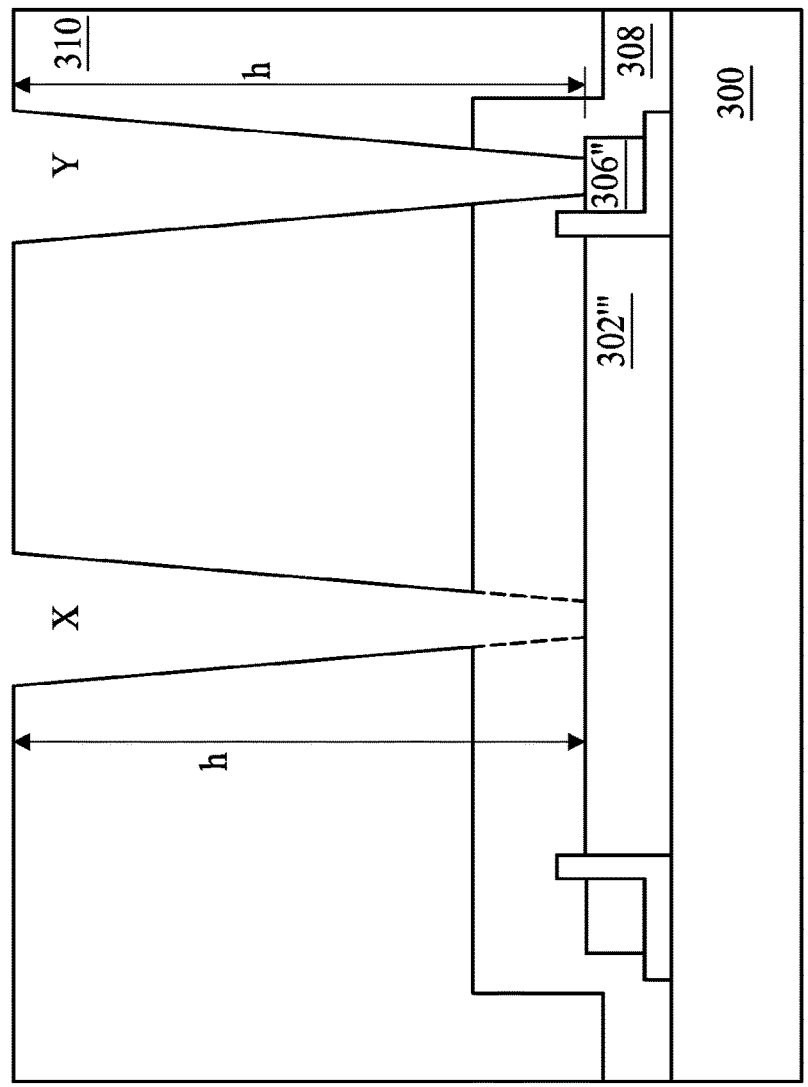

The method then proceeds to operation 214 with forming an inter-metal dielectric layer 310 over the substrate 300 as shown in FIG. 3H. In some embodiments, an etching stop layer 308 may be formed between the inter-metal dielectric layer 310 and the substrate 300.

Figure 3J:
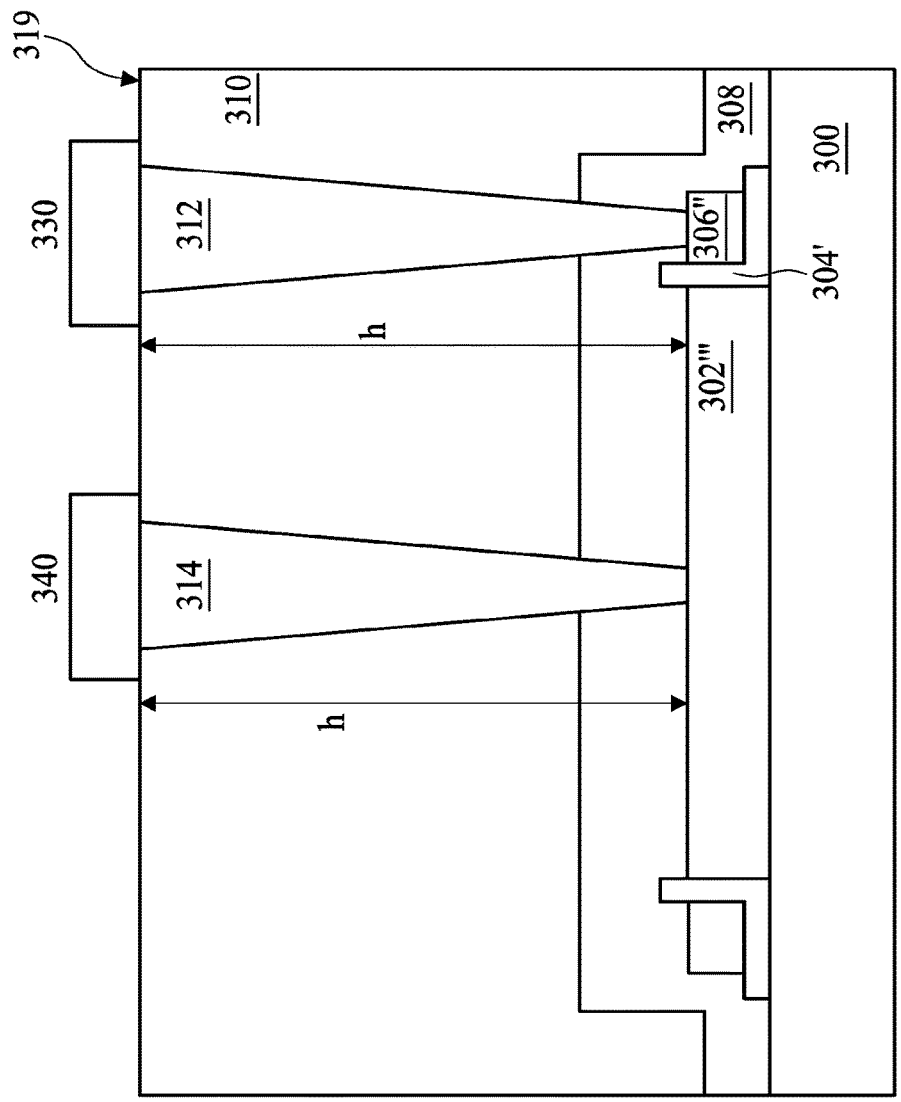

Since the two electrodes (i.e., 302''' and 306") of the MIM capacitor 301 are substantially coplanar, the formed vias 312 and 314 may include a same height "h". More specifically, as shown in the illustrated embodiment of FIG. 3I, the inter-metal dielectric layer 310 is etched to form two trenches X and Y. Trenches X and Y have the same height "h". Referring to FIG. 3J, the method 200 continues to operation 216 where conductive material is formed within trenches X & Y to form vias 314 and 312. In some embodiments, via 312 penetrates through the inter-metal dielectric layer 310 and is configured to connect a conductive plate (e.g., an electrode 330) on a top surface 319 of the inter-metal dielectric layer 310 and the second electrode (e.g., 306") of the MIM capacitor 301. Additionally, in some embodiments, via 314 penetrates through the inter-metal dielectric layer 310 and is configured to connect a conductive plate (e.g., an electrode 340) on a top surface 319 of the inter-metal dielectric layer 310 and the first electrode (e.g., 302''') of the MIM capacitor 301. More specifically, in some embodiments, vias 312 and 314 are formed by the following steps: etching the inter-metal dielectric layer 310 to form two passages (or trenches) that penetrate from the top surface 319 to the first electrode (metal layers 302''') and the second electrode (metal layer 306") and then filling the passages with conductive material. The etching of the inter-metal dielectric layer 310 may include a plasma-induced etching process.

Such a substantially coplanar surface shared by the first electrode 302''' and the second electrode 306" of the MIM capacitor 301 provide various advantages. For instance, while forming the trenches X and Y, the etching of the inter-metal dielectric layer 310 may not cause damage to either one of the electrodes. More specifically, as shown in the illustrated embodiment of FIG. 3J, each the etched trenches X and Y (i.e., the to-be vias) has the same height "h", which means a same amount of time may be used to reach such same-height trenches. In turn, both of the electrodes experience a same amount of exposure (e.g., plasma energy) so neither of the electrodes will suffer a longer etching time and thus damage due to over exposure to plasma energy may be avoided. As such, an extra etching process may be advantageously avoided as well.

Referring now to FIGS. 4A and 4B, examples of the shape of the first electrode 302''', the insulator layer 304', the second electrode 306", and the corresponding vias 312 and 314 are respectively shown from a top view. In the example of FIG. 4A, the first electrode 302''', the insulator layer 304', and the second electrode 306" form concentric circles. In the example of FIG. 4B, the first electrode 302''' and the insulator layer 304' form concentric circles and the second electrode 306" includes a protruded area that is configured to form the via 312.

Referring now to FIGS. 5A and 5B, examples of the shape of the first electrode 302''', the insulator layer 304', the second electrode 306", and the corresponding vias 312 and 314 are respectively shown from a top view. In the example of FIG. 5A, the first electrode 302''', the insulator layer 304', and the second electrode 306" each forms a square shape. Further, such a square shape includes four rounder corners. In some alternative embodiments, the first electrode 302''', the insulator layer 304', and the second electrode 306" may each form a polygon shape with at least one rounded corners and will still fall within the scope of the present disclosure. In the example of FIG. 5B, similar to FIG. 5A, the first electrode 302''' and the insulator layer 304' each forms a square shape with rounded corners. However, the second electrode 306" includes a protruded area that is configured to form the via 312.

The present disclosure provides various embodiments of methods to fabricate a metal-insulator-metal (MIM) capacitor. In an embodiment, a method includes forming a first metal layer over a substrate; forming an insulator layer over the first metal layer, wherein the first metal layer is disposed along a first sidewall of the insulator layer; forming a second metal layer along a second sidewall of the insulator layer such that a first surface of the first metal layer is substantially coplanar with a second surface of the second metal layer, wherein the second sidewall of the insulator layer opposes the first sidewall of the insulator layer; etching the first metal layer and the second metal layer to form a fin feature from the insulator layer that protrudes beyond the first metal layer and the second metal layer; and forming a first via and a second via that are each coupled to the first metal layer and the second metal layer respectively.

In another embodiment, a method of fabricating a metal-insulator-metal (MIM) capacitor structure on a substrate includes forming a patterned metal layer over the substrate; forming an insulator layer over the patterned metal layer; forming a second metal layer over the insulator layer; removing part of the insulating layer and part of the second metal layer thereby forming a substantially coplanar surface that is formed by the patterned metal layer, the insulator layer, and the second metal layer; removing a portion of the second metal layer and a portion of the patterned metal layer to form a fin from the insulator layer that protrudes beyond the first metal layer and the second metal layer; and forming an inter-metal dielectric layer over the fin.

Yet in another embodiment, a metal-insulator-metal (MIM) capacitor structure is provided. The MIM capacitor structure includes a substrate; a first meal layer on the substrate; an insulator layer on the substrate that surrounds a sidewall of the first metal layer; and a second metal layer on the substrate that surrounds a side wall of the insulator layer, wherein the first metal layer and the second metal layer include a coplanar surface that is opposite from the substrate.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure comprising:
    an insulator layer disposed over a substrate, the insulator layer having a bottom surface facing the substrate;
    a first metal layer disposed over the substrate on a first side of the insulator layer, the first metal layer having a bottom surface facing the substrate, the bottom surface of the first metal layer being substantially level with the bottom surface of the insulator layer; and
    a second metal layer disposed over the substrate on a second side of the insulator layer, wherein a first portion of the insulator layer is disposed between the substrate and the second metal layer, so as to prevent the second metal layer from interfacing with the substrate.

2. The MIM capacitor structure of claim 1, wherein the first metal layer has a top surface facing away from the substrate, and wherein the second metal layer has a top surface facing away from the substrate, wherein the top surface of the second metal layer is substantially coplanar with the top surface of the first metal layer.

3. The MIM capacitor structure of claim 2, wherein a second portion of the insulator layer is disposed between the top surfaces of the first and second metal layers.

4. The MIM capacitor structure of claim 1, further comprising an etch stop layer disposed directly on the insulator layer, the first metal layer, and the second metal layer such that the etch stop layer physically contacts the insulator layer, the first metal layer, and the second metal layer.

5. The MIM capacitor structure of claim 1, further comprising:
a dielectric layer disposed over the substrate;
a first via extending through the dielectric layer to the first metal layer, the first via having a height; and
a second via extending through the dielectric layer to the second metal layer, the second via having the height of the first via.

6. The MIM capacitor structure of claim 1, wherein the first metal layer physically contacts the first side of the insulator layer and the second metal layer physically contacts the second side of the insulator layer.

7. The MIM capacitor structure of claim 1, wherein the insulator layer extends from the substrate to a first height over the substrate, and
wherein the insulator layer extends from the substrate to a second height over the substrate, the second height being greater than the first height.

8. A metal-insulator-metal (MIM) capacitor structure comprising:
a first metal layer disposed over a substrate, the first metal layer having a top surface facing away from the substrate and an opposing bottom surface facing the substrate;
a second metal layer disposed over the substrate, the second metal layer having a top surface facing away from the substrate and an opposing bottom surface facing the substrate, the top surface of the second metal layer being substantially coplanar with the top surface of the first metal layer; and
an insulator layer disposed between the first metal layer and the second metal layer, the insulator layer having a top surface facing away from the substrate and an opposing bottom surface facing the substrate, the bottom surface of the insulator layer being substantially coplanar with the bottom surface of the first metal layer, wherein the insulator layer is further disposed between the substrate and the second metal layer, so as to prevent the second metal layer from interfacing with the substrate.

9. The MIM capacitor structure of claim 8, wherein the top surface of the insulator layer is non-coplanar with respect to the top surfaces of the first and second metal layers.

10. The MIM capacitor structure of claim 8, wherein the insulator layer includes a portion extending from the bottom surface of the second metal layer to the substrate.

11. The MIM capacitor structure of claim 8, further comprising an etch stop layer disposed over the first metal layer, the second metal layer, the insulator layer, and the substrate such that the etch stop layer physically contacts the first metal layer, the second metal layer, the insulator layer, and the substrate.

12. The MIM capacitor structure of claim 11, further comprising
a first via extending through the etch stop layer to the first metal layer, the first via having a height; and
a second via extending through the etch stop layer to the first metal layer, the second via having the height of the first via.

13. The MIM capacitor structure of claim 11, wherein the substrate is formed of a dielectric material.

14. The MIM capacitor structure of claim 8, further comprising an etch stop layer disposed over the first metal layer, the insulator layer, and the second metal layer such that the etch stop layer physically contacts a first sidewall of the second metal layer and the insulator layer physically contacts a second sidewall of the second metal layer, the first sidewall opposing the second sidewall.

15. The MIM capacitor structure of claim 8, wherein the bottom surface of the first metal layer is non-coplanar with respect to the bottom surface of the second metal layer.

16. A metal-insulator-metal (MIM) capacitor structure, comprising:
a substrate;
a first metal layer disposed on the substrate;
an insulator layer disposed on the substrate that is adjacent a sidewall of the first metal layer; and
a second metal layer disposed on the substrate that is adjacent a sidewall of the insulator layer, wherein the first metal layer has a top surface that is substantially coplanar with a top surface of the second metal layer, wherein the insulator layer is further disposed between the substrate and the second metal layer, so as to prevent the second metal layer from interfacing with the substrate.

17. The MIM capacitor structure of claim 16, wherein the insulator layer includes a top surface that is non-coplanar with respect to the top surfaces of the first and second metal layers.

18. The MIM capacitor structure of claim 16, wherein, from a top view, the first metal layer, the insulator layer, and the second metal layer form concentric circles.

19. The MIM capacitor structure of claim 16, wherein, from a top view, each of the first metal layer, the insulator layer, and the second metal layer forms form a polygon shape with rounded corners.

20. The MIM capacitor structure of claim 16, wherein the insulator layer has a bottom surface that is substantially coplanar with a bottom surface of one of the first and second metal layers.

* * * * *